United States Patent [19]

Lorenze, Jr. et al.

[11] 4,069,095

[45] Jan. 17, 1978

[54] METHOD OF PREPARING PHOTODETECTOR ARRAY ELEMENTS

[75] Inventors: Robert V. Lorenze, Jr., Westford; Miriam F. Young, Dorchester, both of Mass.

[73] Assignee: Honeywell Inc., Minneapolis, Minn.

[21] Appl. No.: 720,917

[22] Filed: Sept. 7, 1976

[51] Int. Cl.² .................. B44C 1/22; C03C 15/00; C03C 25/06
[52] U.S. Cl. .................. 156/632; 29/572; 29/580; 156/633; 156/659; 427/124
[58] Field of Search .................. 357/30, 55; 250/332; 96/1 PC, 36.2, 38.3, 38.4; 29/572, 580; 427/74–77, 88, 123, 124; 156/3, 11, 17, 18, 629, 632, 633, 634, 659, 661, 664

[56] References Cited

U.S. PATENT DOCUMENTS

| 2,852,648 | 9/1958 | Duffield | 427/76 X |
| 3,452,198 | 6/1969 | White | 29/572 X |

*Primary Examiner*—William A. Powell
*Attorney, Agent, or Firm*—John S. Munday

[57] ABSTRACT

A method of preparing photodetector array elements from a body of photodetector material wherein conductive layers of a metal are formed on selected portions of a substrate, the conductive layers are coated with a photoresist material, an adhesive layer is deposited on the photoresist and the remaining substrate, a body of photodetector material is bonded to the adhesive, and individual photodetector elements are delineated from the body to form the elements of the array and to expose the edges of the photoresist material, and the photoresist layer and material deposited thereon are removed.

5 Claims, 8 Drawing Figures

METHOD OF PREPARING PHOTODETECTOR ARRAY ELEMENTS

BACKGROUND OF THE INVENTION

The Government has rights in this invention pursuant to contract No. F33615-74-C-1069 awarded by the Department of the Air Force.

Interconnection of individual elements in a photodetector array has been found to be a primary source of device failure. Advances in technology have produced arrays which have many individual units. This large number of individual units in an array provides a great number of data points which can be meaningfully processed. As the individual elements are more closely spaced to one another, and as more of them are employed in a single array, the greater the likelihood of an interconnection being the cause of failure of one or more of the units. The accuracy, and the ultimate utility, of these arrays depends significantly on achieving a very low failure rate of individual elements. One significant source of failure is the damage to conductive layers on the substrate during manufacture of the elements. This damage is often caused during removal of the extraneous adhesive used to bond the photodetector body to the substrate prior to delineation of the elements.

It is conventional to prepare individual elements from a photodetector body by using a mask, wherein the unwanted portions of the body and adhesives are removed by a process of removal which does not penetrate the mask and disturb the desired elements. It is during this removal of unwanted portions of the body and adhesive that damage to the lands can occur.

Likewise, when the mask itself is removed, damage to either the lands or the detector elements themselves is potentially a problem. Any damage to either can and often does result in failure of the later connected leads.

DESCRIPTION OF THE PRIOR ART

U.S. Pat. No. 3,883,437, describes a particular device showing the utility of an image scanned array of infrared radiation detectors in which signals generated therefrom are employed for subsequent processing.

U.S. Pat. No. 3,412,456 discloses a method for producing semiconductor devices wherein wire leads are attached to the semiconductor element.

U.S. Pat. No. 2,989,426 discloses a method of removing unused portions of a semiconductor. Various methods mentioned include etching through chemical and/or electrolytic means. Also disclosed is sandblasting as a method for removing unwanted material.

U.S. Pat. No. 3,846,822 discloses a method in which a field effect transistor having a source, channel, drift and drain regions, and a gate electrode electrically isolated from the drift region is made by using an oxide mesa to define the boundries of the gate electrode, drift region and drain region. The gate electrode is formed by using the mesa as a shadow mask during an ion milling operation.

Finally, U.S. Pat. No. 3,574,926 describes a process for the manufacture of an electric resistance for a hybrid miniaturized circuit from a wafer of a semiconductor material by preparing the wafer with dimensions exceeding those corresponding to the required dimensions, diamond cutting the wafer into smaller sizes, and ultimately adjusting the smaller wafers to the required resistance value by removing material therefrom by means of an abrasive powder stream.

OBJECTS OF THE INVENTION

It is therefore an object of this invention to provide a method for preparation of photodetector elements for an array in which subsequent failure of interconnection of the elements is minimized.

Another object of this invention is to provide a method for preparing array elements without having any damage caused to the conductive lands associated therewith.

Yet another object of this invention is to provide a method for preparing array elements without having the elements damaged during removal of the unwanted portions of the adhesive layer.

Other objects will appear hereinafter.

DESCRIPTION OF THE INVENTION

It has now been discovered that the above and other objects of this invention can be accomplished in the following manner. Specifically, it has been discovered that an improved method of preparing photodetector array elements from a body of photodetector material can be accomplished as follows. A desired number of conductive layers are formed on selected portions of a substrate and subsequently coated with a photoresist material. One such suitable photoresist material is Kodak Metal Etch Resist, manufactured by the Kodak Co. The photoresist layer is exposed through a mask and developed so that the conductive layers and other portions of the substrate which are later to be cleared for interconnect purposes are covered with resist layer. Depending upon the type of resist which is employed, this layer is typically 1 to 2 micrometers in thickness. Many commercially available photoresists are suitable for the method of this invention, with the only requirement being that the photoresist itself be inert to the conductive lands.

An adhesive layer is then deposited on the photoresist and all of the remaining substrate. Sufficient quantity of the adhesive, which can be any of the conventional adhesives such as the various commercially available epoxy resins, is deposited in sufficient depth so that the next step, bonding the photodetector material to the adhesive can be accomplished while maintaining the body of material parallel to the substrate.

The next step in the process is to delineate the individual photodetector elements from the body to form the array. This is accomplished by conventional methods, such as by using masks which protect the desired portions of the semiconductor during removal of the undesired portions. During this delineation step, it is necessary to remove a sufficient quantity of the adhesive and semiconductor body to thereby expose the edges of the previously utilized photoresist material.

Finally, the photoresist layer and all of the material remaining thereon are removed in a conventional manner. Typically, a solvent such as trichloroethylene, manufactured by the J. T. Baker Chemical Company, can be used with the aforementioned photoresist. Other conventional solvents for the photoresist may be used so long as they do not react with or damage any of the materials forming the conductive lands and the individual photodetector elements.

As mentioned above, the adhesive layer in the process of this invention is relatively thick, typically 0.01 millimeters thick. Preferably, the adhesive layer should range between 0.001 millimeters and 0.02 millimeters in thickness. Because of the thickness of the adhesive layer, it is sometimes thicker than the photodetector element which forms the various parts of the array. It will be appreciated that the use of a relatively thick layer of adhesive, which by its very nature is difficult to remove since its purpose is to bond the the photodetector body to the substrate, can be the source of potential damage to either the individual elements or the conductive lands during the removal of that adhesive. Any inconsistency in either the elements or the conductive lands brings about a potential loosening of the bond between either the land or the element and the interconnecting material.

Finally, it is contemplated that the elements and the conductive layers will be subsequently interconnected to one another in the appropriate form to result in the production of a useful array.

DESCRIPTION OF THE DRAWINGS

For a more complete understanding of the invention, reference is hereby made to the drawings, in which:

As shown in FIG. 1, a substrate 12 is prepared in a conventional manner for utilization as part of a photodetector array. Metal lands 14 are attached to the substrate in a conventional manner to conduct signals generated by the photodetector once leads are attached to the photodetector and the lands.

As shown in FIG. 2, a photoresist material 16 is coated on the conductive layers 14.

FIG. 3 shows the addition of a quantity of adhesive 18 onto the photoresist 16 and the remaining substrate 12, wherein the quantity is sufficient to permit the bonding of a body of photodetector material 20 to said adhesive in a plane parallel to the plane of the substrate 12.

FIGS. 4, 5 and 6 show the delineation of individual photodetector elements from the body 20 of the photodetector material to form individual elements of the array. As shown in FIG. 4, a mask 22 is placed on the photodetector body 20. In FIG. 5, the undesired portions of the photodetector body 20 have been removed, through an etching process of conventional technology, leaving a quantity of the adhesive 18 covering the photoresist layers 16 on top of the conductive layers 14. FIG. 6 shows the results of further delineation wherein additional undesirable photodetector body is removed at an angle with respect to the plane of the substrate 12 so that edges 15 of the photoresist materials 16 are exposed. This may be done by air abrasion or other means conventionally available to those skilled workers in the art. Since the photoresist material 16, and additionally a quantity of adhesive 18, are covering the surface portions of the metal conductive layers 14, they are protected from damage during this final delineation step.

The array is then emersed in a photoresist solvent solution to remove all of the photoresist layer and the material deposited thereon.

Figure 1:
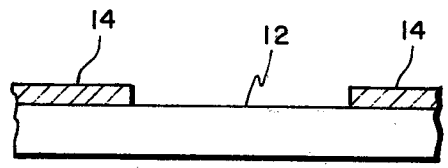
FIGS. 1 through 8 illustrate a preferred method according to this invention by showing a sectioned view of a substrate as the individual steps are taken to mount individual photodetector elements on the substrate, resulting ultimately in an interconnected device.
Figure 2:
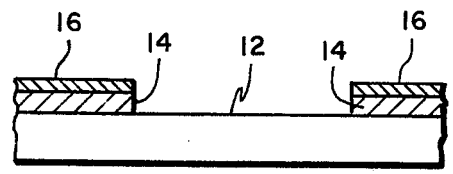
Figure 3:
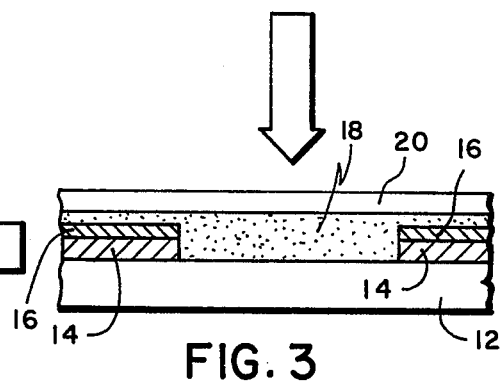
Figure 4:
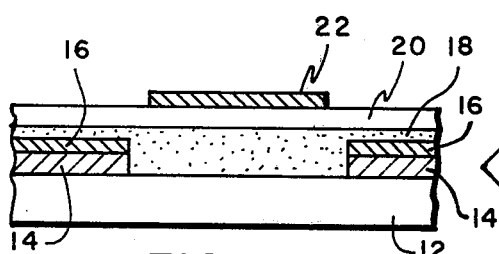
Figure 5:
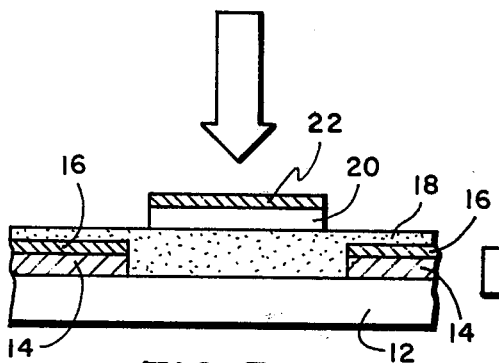
Figure 6:
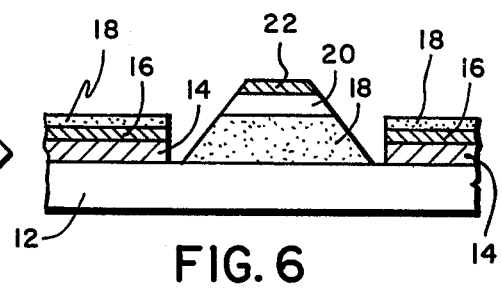
Figure 7:
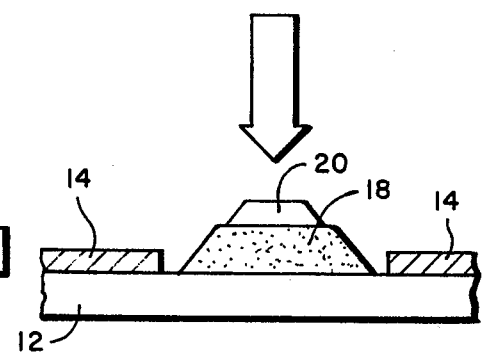

FIG. 7 shows an array in which the photodetector elements 20 are mounted on a relatively thick adhesive layer 18 and are spaced from adjacent conductive layers 14 on the substrate 12.

Figure 8:
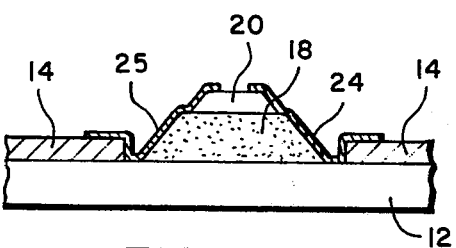

FIG. 8 shows the addition of interconnecting elements 24 and 25 between the lands 14 and the individual element 20. Such interconnecting elements 24 and 25 are typically vacuum deposited metal thin films.

Fabrication of detector arrays applying the process described herein has resulted in devices which operate effectively and efficiently, with a high degree of realibility of the individual detector elements in the array. Failure rate, due to lack of a proper bond between the lead and the photodetector element or the conductive land, has been greatly improved, giving results superior to other methods previously employed.

The embodiments of the invention in which an exclusive property or right is claimed are defined as follows:

1. A method of preparing photodetector array elements from a body of photodetector material, comprising:

forming conductive layers on selected portions of a substrate;

coating said conductive layers with a photoresist material;

depositing an adhesive layer on the photoresist and the remaining substrate to a sufficient depth to cover said photoresist;

bonding a body of photodetector material to said adhesive, such that said body is parallel to said substrate;

delineating individual photodetector elements from said body to form elements of an array, thereby exposing the edges of said photoresist material; and removing the photoresist layer and material deposited thereon.

2. A method of claim 1 wherein said adhesive layer is about 0.01 millimeters thick.

3. The method of claim 2 wherein said adhesive layer ranges from 0.001 millimeters to 0.02 milliters thick.

4. The method of claim 1 wherein said adhesive layer remaining on said individually delineated photodetector elements is thicker than the photodetector element itself.

5. The method of claim 1, including the subsequent step of interconnecting said elements to said conductive layers to form an array.

* * * * *